United States Patent [19]

Mullins

[11] Patent Number: 4,736,069
[45] Date of Patent: Apr. 5, 1988

[54] HOUSING FOR VIBRATION SENSITIVE CIRCUITS

[75] Inventor: Aaron B. Mullins, Hurst, Tex.
[73] Assignee: Motorola, Inc., Schaumburg, Ill.
[21] Appl. No.: 913,206
[22] Filed: Sep. 30, 1986
[51] Int. Cl.$^4$ .............................................. H05K 9/00
[52] U.S. Cl. .................................... 174/35 R; 361/424
[58] Field of Search ............ 174/35 R, 35 MS, 52 FP; 330/68, 170; 331/67; 361/424

[56] References Cited

U.S. PATENT DOCUMENTS

| | | | |
|---|---|---|---|
| 2,088,454 | 7/1937 | Whisk | 174/35 R |
| 2,219,941 | 10/1940 | Rochow | 174/35 MS |
| 4,091,232 | 5/1978 | Lenk et al. | 174/52 |
| 4,303,934 | 12/1981 | Stitt | 174/52 FP X |
| 4,313,025 | 1/1982 | Grube, Jr. | 174/50 |

*Primary Examiner*—R. L. Moses
*Assistant Examiner*—David A. Tone
*Attorney, Agent, or Firm*—Thomas G. Berry

[57] ABSTRACT

Disclosed is an improved housing being comprised of a substrate and a cover that is plated to provide RF shielding. The substrate and cover are constructed of a like material to keep the coefficients of vibration approximately identical. Preferably, the substrate and cover material are ceramic thereby providing a rigid structure that minimizes vibration degradation.

9 Claims, 4 Drawing Sheets

300

400

HOUSING FOR VIBRATION SENSITIVE CIRCUITS

FIELD OF THE INVENTION

The present invention relates generally to housings, and more particularly to radio frequency (RF) shielded housings and is more particularly directed to a method and apparatus for improving the vibration performance of shielded circuits.

BACKGROUND ART

It is common practice by those of ordinary skill in the art to shield high frequency circuits to prevent the high frequency (typically RF) energy from radiating (spraying) into other circuits and degrading their performance. Often, circuits such as power amplifiers or voltage controlled oscillators (VCO's) are placed in metal cast housings having a metal cover (generally steel) to enclose the circuit. Any radiated energy is conducted to ground by the metal housing and cover, thereby shielding the exterior circuits from the contaminating energy.

However, such shielding practices may impair the performance of the high frequency circuit in adverse conditions such as vibration and temperature. Those skilled in the art will appreciate that high frequency circuits are affected by stray capacitance created by the metal cover and metal plating on the printed circuit (PC) board or substrate upon which the high frequency circuit is mounted. The stray capacitance is a function of the distance between the cover and the substrate. In vibration, the metal cover generally vibrates at one rate while the substrate vibrates at another rate. This creates a time varying capacitance due to the changing distances between the cover and the substrate. Thus, the benefit obtained by the generally accepted engineering practice of shielding the high frequency circuit incorporates the detriment of poor vibration performance. Accordingly, there is a need in the art for a method and apparatus for minimizing the vibration degradation experienced by shielded circuits.

SUMMARY OF THE INVENTION

Accordingly, it is an object of this invention to provide an improved housing which overcomes the detriments of the prior art.

It is a further object of the present invention to provide a housing which minimizes vibration degradation in vibration sensitive circuits.

It is the ultimate object of the present invention to provide a rigid integral housing that improves vibration performance of VCO's and other high frequency circuits.

Accordingly, these and other objects are achieved in the present improved housing for vibration sensitive circuits.

Briefly, according to the invention, a housing is comprised of a substrate and a cover that is plated to provide RF shielding. The substrate and cover are constructed of a like material to keep the coefficients of vibration approximately identical. Preferably, the substrate and cover material are ceramic thereby providing a rigid structure that minimizes vibration degradation.

BRIEF DESCRIPTION OF THE DRAWINGS

The features of the present invention which are believed to be novel are set forth with particularity in the appended claims. The invention, together with further objects and advantages thereof, may be understood by reference to the following description, taken in conjunction with the accompanying drawings, and the several figures of which like reference numerals identify like elements, and in which:

DETAILED DESCRIPTION OF THE PREFERRED EMBODIMENT

Figure 1:
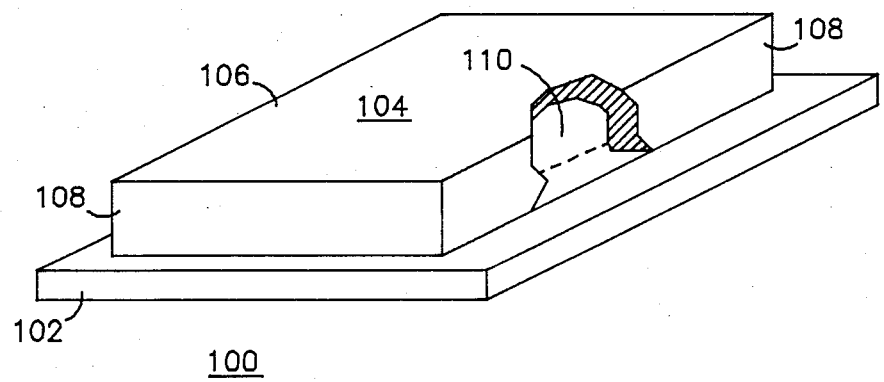
FIG. 1 is a partial cutaway perspective view of the housing of the invention.

Referring now to the drawings and in particular to FIG. 1, there is shown the housing 100 of the present invention. The housing is comprised of a substrate 102 and a cover 104. The cover 104 has a top portion 106 and side portions 108 (two shown). Although illustrated in FIG. 1 as a rectangle, those skilled in the art will appreciate that the cover 104 may be of any convenient geometric shape, such as, for example, square or triangular. Preferably, the substrate 102 and the cover 104 are constructed of a like ceramic material such that the top 106 and the substrate 102 vibrate at a substantially identical rate thereby minimizing vibration degradation. The cover 104 may be attached to the substrate 102 by any convenient means, such as, for example, solder reflow technology as is commonly understood in the art. The cover 106 and at least a portion of the sides 108 are plated by any suitable plating material such as copper or gold to provide an RF shield to eliminate or minimize radiated RF energy. In the preferred embodiment, the substrate 102 and the cover 104 are constructed of 96% alumina ceramic, which provides a rigid integral structure that alleviates the detriment of the prior art. Internally, at least one circuit area 110 is created to receive the components of any vibration sensitive circuit such as a voltage controlled oscillator (VCO). Multiple circuit areas may be created by using partition walls as is known in the art.

Figure 2:
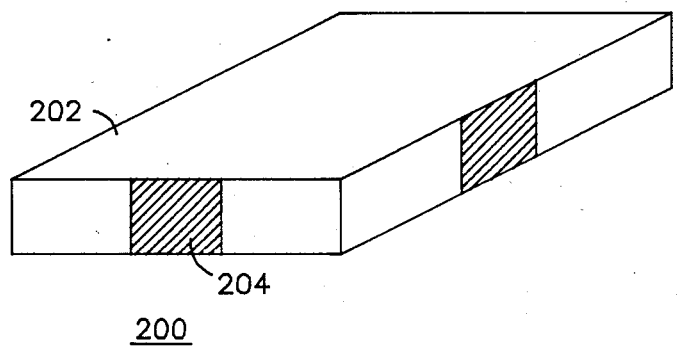
FIG. 2 is an alternate cover member of the housing of FIG. 1.

Referring now to FIG. 2, an alternate embodiment of the cover 104 is shown. To provide good RF shielding, the top portion 202 is preferably completely plated by any suitable plating material. However, only a portion of the sides need to be plated (204) so that the top portion 202 may be grounded. Thus, a cost savings may be realized by selectively plating a portion of the sides. Although FIG. 2 illustrates a "center strap" of plating material 204 it will be understood by those of ordinary skill in the art that the side plating portion 204 may be located anywhere along one or more of the sides, and that the only requirement is that the top portion 202 be effectively grounded. Of course, the effectiveness of the RF shielding may be compromised by such selective plating practice and preferably the entire side portion is plated.

Figure 3:
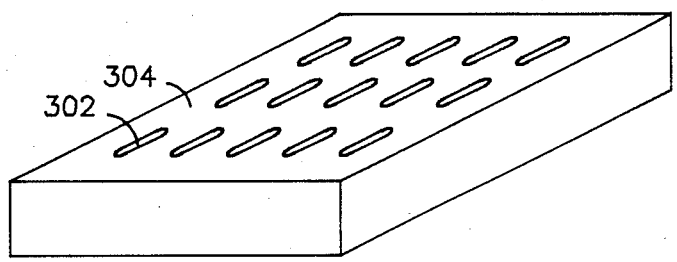
FIG. 3 is another alternate cover of the housing of FIG. 1.

Referring now to FIG. 3, another alternative of the cover is illustrated. In FIG. 3 the cover 300 has a plurality of slots 302 positioned in any suitable pattern in the top portion 304 of the cover 300. As previously mentioned, a convenient means of attaching the cover to the substrate is through the solder reflow process. Accordingly, the slots 302 provide a convenient means to cleanse the solder flux from inside the cavity created by the joined cover and substrate. Generally, the slots may be of any convenient size, however, extraordinarily wide slots may degrade the RF shielding and vibration performance.

Figure 4:
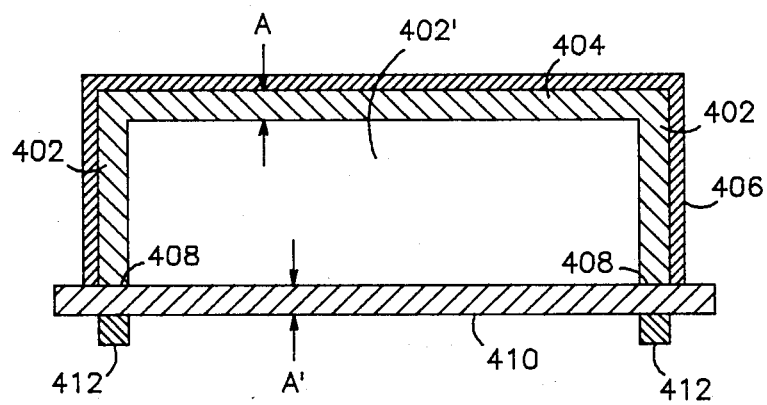
FIG. 4 is a cross sectional view of the present invention.

Referring now to FIG. 4, a cross sectional view of the present invention is shown. The cross sectional cover includes side portions 402 and 402' (which represents the inside of one side portion), and a top portion 404. Preferably, the top portion 404 and each side portion 402 is plated with a suitable plating material 406. Additionally, the "footprint" 408 is also plated to provide a suitable surface for soldering. Preferably, the thickness (dimension A) of the top portion 404 and the thickness (dimension A') of the substrate 410 are approximately identical to minimize vibration coefficients. To optimally exploit the advantages of the present invention, the substrate/cover assembly 400 is preferably mounted such that the top portion 404 and the substrate 410 are equally loaded. That is, the movement in vibration of either the top portion 404 or the substrate 410 is, relative to the other, unaltered. In the preferred embodiment, the assembly 400 is mounted on standoffs or "bosses" 412 such that the substrate 410 may vibrate to the same extent as the top portion 404 of the cover.

Figure 5:
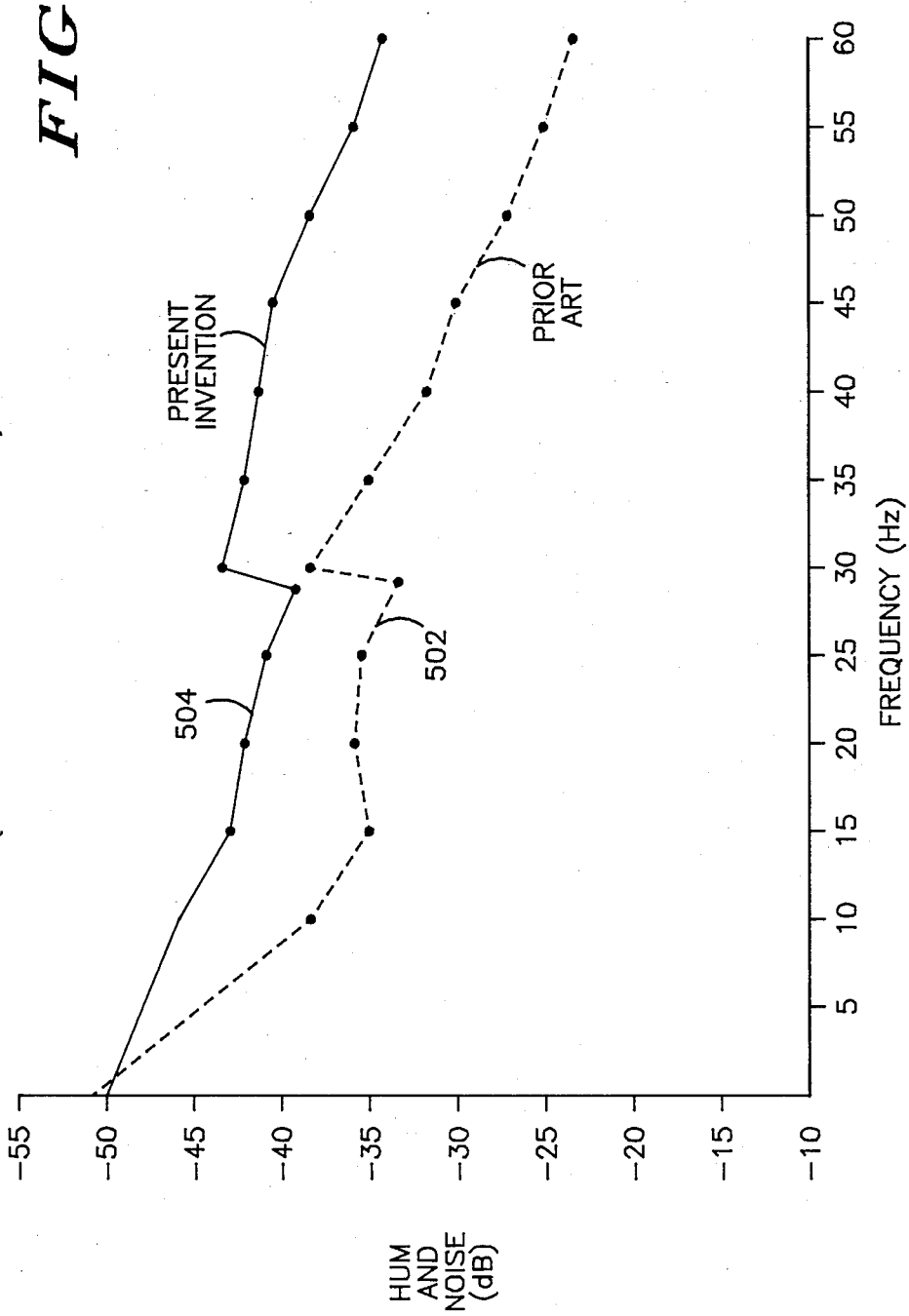
FIG. 5 is a graphical illustration of the improvement of the present invention over the prior art.

Referring now to FIG. 5, an illustration of the hum and noise performance of a voltage controlled oscillator (VCO) in vibration is shown. Curve 502 represents the performance of a VCO mounted on a substrate in a metal cast housing having a metal top cover. The upper curve 504 illustrates the improved hum and noise performance of the present invention housing a VCO on a ceramic substrate having a like ceramic cover metallized to provide RF shielding.

Figure 6:
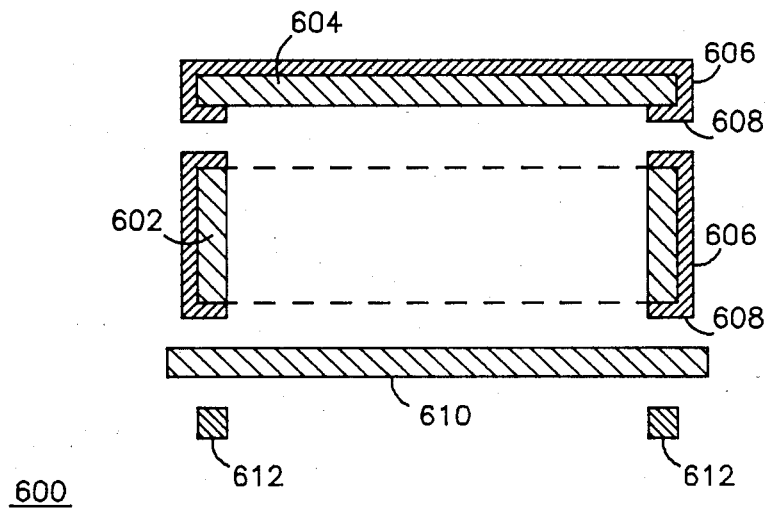
FIG. 6 is an exploded cross sectional view illustrating an alternative construction of the present invention.

Referring now to FIG. 6, an alternative assembly of the present invention is shown. The assembly 600 is comprised of a separate top portion 604, a side spacer portion 602 and the substrate 610. The top portion 604 and the side spacer 602 are preferably plated by an effective amount of a suitable plating material 606. To provide effective grounding, the top portion includes a plated "footprint" 608' that may be electrically coupled to the side spacer plating by any suitable means. As previously mentioned, the side spacer also includes a plated footprint 608 to facilitate connection to the substrate 610. The assembly 600 is preferably mounted using a standoff 612 to enable the top portion 604 and the substrate 610 may vibrate at substantially the same rate. A cost savings may be had by the alternative of FIG. 6 in that the side spacer need not be constructed of the same material as the top portion and the substrate. The only requirement is that the side spacer allow the top portion to be effectively grounded by a suitable means. However, as previously mentioned, the effectiveness of the RF shielding may be compromised by the material selection and grounding means used in conjunction with the side spacer 602.

Figure 7:
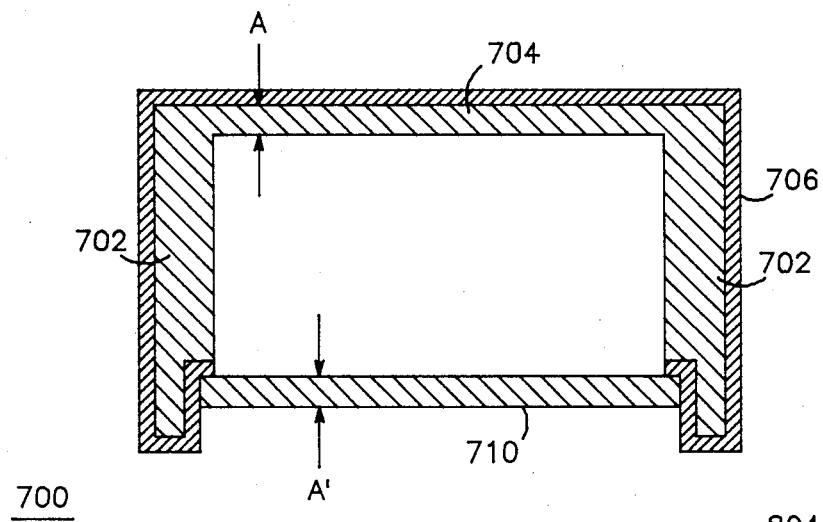
FIG. 7 is a cross sectional view of yet another alternative construction of the present invention.

Referring now to FIG. 7, yet another assembly alternative 700 is shown. In this alternative, the mounting of the assembly is incorporated into the side portion 702 and provision is made to allow attachment of the substrate 710 by solder reflow or other suitable technique. Of course, following the teachings of the present invention, the thickness (dimension A) of the top portion 704 and the thickness (dimension A') of the substrate 710 should be approximately identical to maintain even coefficients of vibration.

Figure 8:
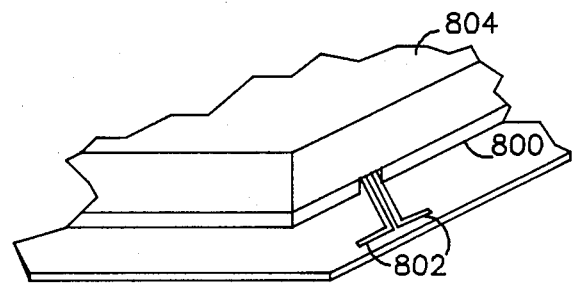
FIG. 8 is a fragmented perspective view illustrating another aspect of the present invention.

Referring now to FIG. 8, another aspect of the invention is illustrated. Those skilled in the art will appreciate that, in prior shielded circuits, the predominate method for providing power and control signals was through a "feedthrough". This required additional tooling to the cover to allow insertion of the feedthrough, which in turn increased both cost and assembly time. The present invention provides for the selective plating of the "footprint" such that openings are made to allow printed runners (or the like) to be conveniently routed to and from the circuit under the cover. As seen in FIG. 8, selective plating of the footprint 800 may create a "window" through which PC runners 802 may pass to communicate information to and from the circuit under the cover 804.

In summary, the present invention provides an improved housing comprised of a substrate and cover which preferably is constructed of a like ceramic material. By keeping the material in the substrate and cover uniform, coefficients of vibration are approximately identical. This keeps the capacitance created by the housing constant thereby improving vibration performance of the circuit contained in the housing.

While a particular embodiment of the invention has been described and shown, it should be understood that the invention is not limited thereto since many modifications may be made. In particular, there are many possible combinations and patterns of slots and grounding strap placements for the cover, and moreover, the present invention contemplates multiple circuit areas within the housing by placing partition walls in the cover. It is therefore contemplated to cover by the present application any and all such modifications that may fall within the true spirit and scope of the basic underlying principles disclosed and claimed herein.

What is claimed is:

1. An improved housing for vibration sensitive circuits, comprising:
    a ceramic substrate having a first thickness for receiving a plurality of components comprising a virbration sensitive circuits;
    a ceramic cover, having at least a portion thereof plated, said cover constructed and arranged to have a thickness substantially equal to said first thickness to equally load said ceramic substrate and said ceramic cover and to enclose said virbration sensitive circuit.

2. The housing of claim 1, wherein said ceramic substrate is constructed of alumina.

3. The housing of claim 1, wherein said ceramic cover is constructed of alumina.

4. The housing of claim 1, wherein said ceramic cover is slotted.

5. An improved housing for a vibration sensitive circuit, comprising:
    an alumina ceramic substrate having a first thickness for receiving a plurality of components comprising a vibration sensitive circuit;
    an alumina ceramic cover, having a top portion having a thickness substantially equal to said first thickness, and four side portions each having a common second thickness, said top poriton being plated and slotted, and at least some of said side poritons being partially plated, said cover constructed and arranged such that said alumina ceramic substrate and said top poriton of said alumina ceramic cover are equally loaded and enclosed said virbration sensitive circuit.

6. A method for improving the vibration performance of a vibration sensitive circuit mounted on a substrate, comprising the steps of:

enclosing said vibration sensitive circuit with a cover constructed of a common material and having a common thickness as the substrate so as to provide equal vibration loading of said substrate and said cover, said substrate having at least a poriton thereof plated.

7. A method for improving the vibration performance of a vibration sensitive circuit mounted on a substrate, comprising the step of:

enclosing said vibration sensitive circuit with a plated cover constructed of a common material as the substrate, said cover and substrate having a common thickness so as to provide equal vibration loading of each of said cover and substrate, said plated cover having at least a top poriton thereof slotted.

8. An improved housing for a vibration sensitive circuit comprising:

a substrate for receiving a plurality of components comprising a vibration sensitive circuit, said substrate being peripherally supported by a supported on a first surface and having a first thickness;

a cover having a top portion having a thickness substantially equal to said first thickness, and having four side poritons each having a common second thickness;

said substrate and said cover being constructed and arranged such that said four side portions are peripherally disposed on a second surface of said substrate to cooperate with said support means to equally load said substrate and said top poriton of said cover.

9. An improved housing for vibration sensitive circuits, comprising:

a substrate for receiving a plurality of components comprising a vibration sensitive circuit, said substrate having a first thickness;

a cover having a top portion having a thickness substantially equal to said first thickness, and having four side portions each having a common second thickness and each having an indention for receiving said substrate said top and side portions being constructed of a common material;

said substrate being constructed and arranged to reside in said indention of said four side portions to equally load said substrate and said top portion of said cover.

* * * * *

UNITED STATES PATENT AND TRADEMARK OFFICE
CERTIFICATE OF CORRECTION

PATENT NO. : 4,736,069

DATED : April 5, 1988

INVENTOR(S) : Mullins, Aaron B.

It is certified that error appears in the above-identified patent and that said Letters Patent is hereby corrected as shown below:

```
Column 4, line 47, "circuits" should be --circuit--.
Column 4, line 52, "virbration" should be --vibration--.
Column 4, line 68, "poriton" should be --portion--.
Column 5, line 2, "poritons" should be --portions--.
Column 5, line 6, "virbration" should be --vibration--.
Column 5, line 14, "poriton" should be --portion--.
Column 5, line 24, "poriton" should be --portion--.
Column 6, line 1, the second use of the word "supported"
    should be --support means--.
Column 6, line 5, "poritons" should be --portions--.
Column 6, line 11, "poriton" should be --portion--.
```

Signed and Sealed this

Twenty-seventh Day of September, 1988

*Attest:*

DONALD J. QUIGG

*Attesting Officer*  *Commissioner of Patents and Trademarks*